United States Patent
Coolbaugh et al.

(10) Patent No.: US 7,645,675 B2
(45) Date of Patent: Jan. 12, 2010

(54) INTEGRATED PARALLEL PLATE CAPACITORS

(75) Inventors: Douglas D. Coolbaugh, Highland, NY (US); Hanyi Ding, Essex Junction, VT (US); Ebenezer E. Eshun, Newburgh, NY (US); Michael D. Gordon, Essex Jct, VT (US); Zhong-Xiang He, Essex Junction, VT (US); Anthony K. Stamper, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/275,544

(22) Filed: Jan. 13, 2006

(65) Prior Publication Data

US 2006/0110897 A1 May 25, 2006
US 2007/0190760 A1 Aug. 16, 2007

(51) Int. Cl.
*H01L 21/20* (2006.01)

(52) U.S. Cl. .................. 438/381; 257/303; 257/306; 257/307; 257/309; 257/E21.648; 257/532; 257/499; 257/E29.001; 438/396; 438/253; 438/244; 438/250; 438/387; 438/393; 438/394; 438/395

(58) Field of Classification Search ............... 257/303, 257/306, 307, 309; 438/381, 396, 253
See application file for complete search history.

(56) References Cited

U.S. PATENT DOCUMENTS

| | | | | |
|---|---|---|---|---|
| 4,409,608 A | * | 10/1983 | Yoder | 257/534 |
| 4,430,690 A | * | 2/1984 | Chance et al. | 361/321.3 |
| 4,825,280 A | * | 4/1989 | Chen et al. | 257/659 |
| 5,351,163 A | | 9/1994 | Dawson et al. | |
| 5,446,337 A | * | 8/1995 | Yokomakura et al. | 313/422 |
| 5,477,407 A | * | 12/1995 | Kobayashi et al. | 361/56 |
| 5,583,359 A | * | 12/1996 | Ng et al. | 257/306 |
| 5,789,791 A | * | 8/1998 | Bergemont | 257/401 |
| 5,834,332 A | * | 11/1998 | Hierold et al. | 438/48 |
| 5,841,579 A | * | 11/1998 | Bloom et al. | 359/572 |
| 5,872,695 A | * | 2/1999 | Fasano et al. | 361/301.4 |
| 5,933,725 A | * | 8/1999 | Kirsch et al. | 438/239 |
| 5,939,766 A | * | 8/1999 | Stolmeijer et al. | 257/534 |
| 5,982,018 A | * | 11/1999 | Wark et al. | 257/532 |
| 6,066,537 A | * | 5/2000 | Poh | 438/393 |
| 6,088,215 A | * | 7/2000 | Webb et al. | 361/306.3 |
| 6,094,335 A | | 7/2000 | Early | |
| 6,100,591 A | * | 8/2000 | Ishii | 257/773 |
| 6,297,524 B1 | * | 10/2001 | Vathulya et al. | 257/303 |
| 6,385,033 B1 | * | 5/2002 | Javanifard et al. | 361/306.2 |

(Continued)

FOREIGN PATENT DOCUMENTS

JP 2004 193602 A 3/2004

*Primary Examiner*—Fernando L Toledo
*Assistant Examiner*—Ankush K Singal
(74) *Attorney, Agent, or Firm*—Anthony J. Canale

(57) ABSTRACT

A parallel plate capacitor formed in the back end of an integrated circuit employs conductive capacitor plates that are formed simultaneously with the other interconnects on that level of the back end (having the same material, thickness, etc). The capacitor plates are set into the interlevel dielectric using the same process as the other interconnects on that level of the back end (preferably dual damascene). Some versions of the capacitors have perforations in the plates and vertical conductive members connecting all plates of the same polarity, thereby increasing reliability, saving space and increasing the capacitive density compared with solid plates.

2 Claims, 3 Drawing Sheets

U.S. PATENT DOCUMENTS

| | | | |
|---|---|---|---|
| 6,410,954 B1 * | 6/2002 | Sowlati et al. | 257/306 |
| 6,430,028 B1 | 8/2002 | Kar-Roy et al. | |
| 6,445,056 B2 * | 9/2002 | Nakashima | 257/532 |
| 6,451,664 B1 | 9/2002 | Barth et al. | |
| 6,459,561 B1 * | 10/2002 | Galvagni et al. | 361/306.3 |
| 6,465,832 B1 * | 10/2002 | Maeda et al. | 257/307 |
| 6,542,352 B1 * | 4/2003 | Devoe et al. | 361/321.2 |
| 6,563,191 B1 * | 5/2003 | Casey et al. | 257/532 |
| 6,690,570 B2 | 2/2004 | Hajimiri et al. | |
| 6,743,671 B2 * | 6/2004 | Hu et al. | 438/253 |
| 6,753,218 B2 * | 6/2004 | Devoe et al. | 438/240 |
| 6,791,175 B2 * | 9/2004 | Matsuo et al. | 257/686 |
| 6,819,542 B2 * | 11/2004 | Tsai et al. | 361/304 |
| 6,822,312 B2 * | 11/2004 | Sowlati et al. | 257/532 |
| 6,897,077 B2 * | 5/2005 | Felber et al. | 438/14 |
| 6,906,905 B1 * | 6/2005 | Chinthakindi | 361/277 |
| 6,909,591 B2 * | 6/2005 | Erickson et al. | 361/303 |
| 6,917,509 B1 * | 7/2005 | Devoe et al. | 361/309 |
| 6,942,901 B1 * | 9/2005 | Van Tassel et al. | 427/458 |
| 6,964,908 B2 * | 11/2005 | Hsu et al. | 438/393 |
| 7,038,296 B2 * | 5/2006 | Laws | 257/534 |
| 7,071,565 B2 * | 7/2006 | Li et al. | 257/775 |
| 7,116,544 B1 * | 10/2006 | Sutardja | 361/306.3 |
| 7,133,294 B2 * | 11/2006 | Patel et al. | 361/782 |
| 7,154,734 B2 * | 12/2006 | Schultz et al. | 361/306.1 |
| 7,160,761 B2 * | 1/2007 | Cleeves et al. | 438/131 |
| 7,161,228 B1 * | 1/2007 | Pettit | 257/532 |
| 7,202,548 B2 * | 4/2007 | Lee | 257/532 |
| 7,259,956 B2 * | 8/2007 | Fong et al. | 361/306.2 |
| 7,262,608 B2 * | 8/2007 | Cheah et al. | 324/662 |
| 7,274,085 B1 * | 9/2007 | Hsu et al. | 257/532 |
| 7,402,449 B2 * | 7/2008 | Fukuda et al. | 438/53 |
| 2002/0022331 A1 * | 2/2002 | Saran | 438/381 |
| 2002/0063272 A1 * | 5/2002 | Miyajima | 257/296 |
| 2003/0161090 A1 * | 8/2003 | Devoe et al. | 361/321.2 |
| 2004/0004241 A1 * | 1/2004 | Aton | 257/306 |
| 2004/0031982 A1 * | 2/2004 | Devries et al. | 257/307 |
| 2004/0061112 A1 * | 4/2004 | Felber et al. | 257/48 |
| 2004/0061177 A1 * | 4/2004 | Merchant et al. | 257/349 |
| 2004/0145056 A1 * | 7/2004 | Gabriel et al. | 257/758 |
| 2004/0222494 A1 * | 11/2004 | Laws | 257/532 |
| 2005/0162236 A1 * | 7/2005 | Casper et al. | 333/116 |
| 2005/0207093 A1 * | 9/2005 | Togashi et al. | 361/321.2 |
| 2005/0219927 A1 * | 10/2005 | Baker et al. | 365/210 |
| 2005/0266652 A1 * | 12/2005 | Chudzik et al. | 438/387 |
| 2006/0003482 A1 * | 1/2006 | Chinthakindi et al. | 438/52 |
| 2006/0061935 A1 * | 3/2006 | Schultz et al. | 361/306.1 |
| 2006/0086965 A1 * | 4/2006 | Sakaguchi et al. | 257/307 |
| 2006/0132148 A1 * | 6/2006 | Cheah et al. | 324/671 |
| 2006/0157770 A1 * | 7/2006 | Park | 257/303 |
| 2006/0180895 A1 * | 8/2006 | Chen et al. | 257/595 |
| 2006/0203424 A1 * | 9/2006 | Chen et al. | 361/306.1 |
| 2006/0205106 A1 * | 9/2006 | Fukuda et al. | 438/52 |
| 2006/0256502 A1 * | 11/2006 | Li et al. | 361/306.1 |
| 2006/0283007 A1 * | 12/2006 | Cros et al. | 29/602.1 |
| 2007/0042542 A1 * | 2/2007 | Barth et al. | 438/243 |
| 2007/0090986 A1 * | 4/2007 | Komatsu et al. | 341/155 |
| 2007/0123015 A1 * | 5/2007 | Chinthakindi et al. | 438/597 |
| 2007/0181924 A1 * | 8/2007 | Baumgartner et al. | 257/296 |
| 2007/0210442 A1 * | 9/2007 | Hess et al. | 257/700 |
| 2007/0279835 A1 * | 12/2007 | Chinthakindi | 361/306.2 |
| 2008/0142861 A1 * | 6/2008 | Collins et al. | 257/296 |

* cited by examiner

INTEGRATED PARALLEL PLATE CAPACITORS

TECHNICAL FIELD

The field of the invention is that of forming a plate capacitor having a set of horizontal conductive plates separated by a dielectric (MIM-CAP).

BACKGROUND OF THE INVENTION

High performance (high Q-value) metal-insulator-metal capacitor (MIM cap) is one of the essential passive devices in RF/Analog circuitry. In order to achieve high-Q value, low resistance metal plates are typically used. In prior work, the bottom plate of a metal-insulator-metal (MIM) capacitor is typically made of back end of the line (BEOL) aluminum metal wire on the xth level of the back end (zero-cost). An additional photolithography mask is used for MIM cap top plate formation. This additional top plate mask leads to extra wafer processing cost of about $25/wafer. In the advanced CMOS technologies with Cu BEOL, up to three masks are employed to create high-Q MIM capacitors.

In an effort to reduce cost, vertical parallel plate capacitors (VPP) have been recently developed/introduced in the advanced Analog/RF CMOS technologies. VPPs capacitor plates are made of BEOL Mx wire fingers and vias. Due to scaling of BEOL wiring width and spacing, the capacitance density of VPP becomes appreciable for technologies with minimum features smaller than 0.25 um. However, the performance of a VPP capacitor is limited because of the high resistance associated with metal fingers/vias, which is particularly troublesome for high frequency application.

As a result, a high performance MIM capacitor is still desirable & needed for Analog/RF CMOS technologies.

SUMMARY OF THE INVENTION

The present invention utilizes BEOL wide Cu planes as MIM capacitor electrodes and the existing inter-level dielectric layers as MIM dielectric films; i.e. the thickness of the capacitor plates and of the dielectric is the same in the capacitor as in the rest of the circuit.

The Mx electrodes are tied together to create a parallel plate capacitor. As a result, the resistance of MIM plates according to the present invention is extremely low, which leads to a high performance MIM capacitor.

The capacitance density for the invented MIM increases as the inter-level dielectric films become thinner for more advanced technologies. Moreover, more BEOL metal wiring levels are employed for advanced technologies, which can lead to higher capacitance density for the present invention because more metal levels can be connected together.

To further enhance capacitance density of this zero-cost high-Q MIM capacitor, Vx vias are added through Mx perforation holes (through-vias). The use of through-vias increases capacitive coupling and reduces/eliminates additional wiring area needed for MIM cap plate connection, which again leads to cap density enhancement.

An Ansoft Q3D simulation indicates that capacitance density improvement of greater than 30% is possible compared with through-via practice.

DETAILED DESCRIPTION

Figure 1:
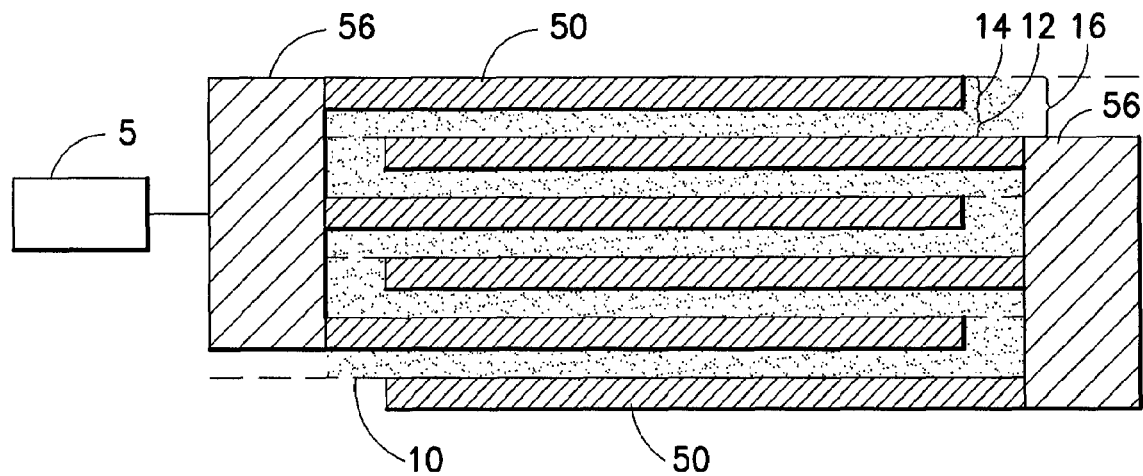
FIG. 1 shows a cross sectional view of a MIM-Cap with solid plates in the capacitor.

FIG. 1 shows a set of solid plates 50 connected alternately by vertical connection bars 56. An important feature of this structure compared with prior MIM capacitors is that the thickness 12 of the dielectric between the plates is greater than before because the thickness 12 is the thickness 16 of the back end levels minus the thickness 14 of the interconnects on that back end level; e.g. if the total thickness of the level is 0.5 microns and the thickness of the interconnect on that level is 0.25 microns, then the thickness 12 of the dielectric is also 0.25 microns. Dashed line 10 indicates the top surface of a layer in the back end. A level in the back end containing a capacitor plate will be referred to as a capacitor level. The foregoing means that the capacitance per unit area (capacitance density) is reduced, but that is more than compensated for by the improved reliability provided by the invention. Box 5 represents schematically interconnections on the levels of the BEOL and the remainder of the integrated circuit.

Fabrication of the invented high-Q MIM is fully compatible with Cu BEOL processing. The plates are deposited in apertures in the interlevel dielectric simultaneously with the other interconnects on that level. The blocks labeled 56 that connect the plates of each polarity are schematic representations. They may be vertical bars of metal, vertically aligned damascene conductors, regular interconnects, or any other structure. Preferably, they are vertically aligned dual damascene structures, so that no additional masks or processing steps are needed. No additional processing steps are added in this invented high-Q MIM. An estimate of the capacitance density for six levels of thin metal wire BEOL in 65 nm technology results in cap density of 0.88 fF/$\mu$m$^2$ when no perforation is assumed.

This no perforation assumption is valid for MIMs that require small plates. When MIM plates become large (approximately 20 microns on edge), perforating of copper plates is necessary in order to achieve uniform copper plate thickness. Significant copper plate thinning is expected when large non-perforated Cu plates are used due to the fast Cu polish rate associated with large plates during CMP processing.

However, the capacitance density loss due to perforation is limited. Based on an Ansoft Q3D simulation using design information for a known process using 90 nm ground rules, the loss of capacitance density from perforation is only about ⅓ of the perforation density (for example, the capacitance reduction comparing 38% perforation to no perforation is only 11.5%).

Figure 2:
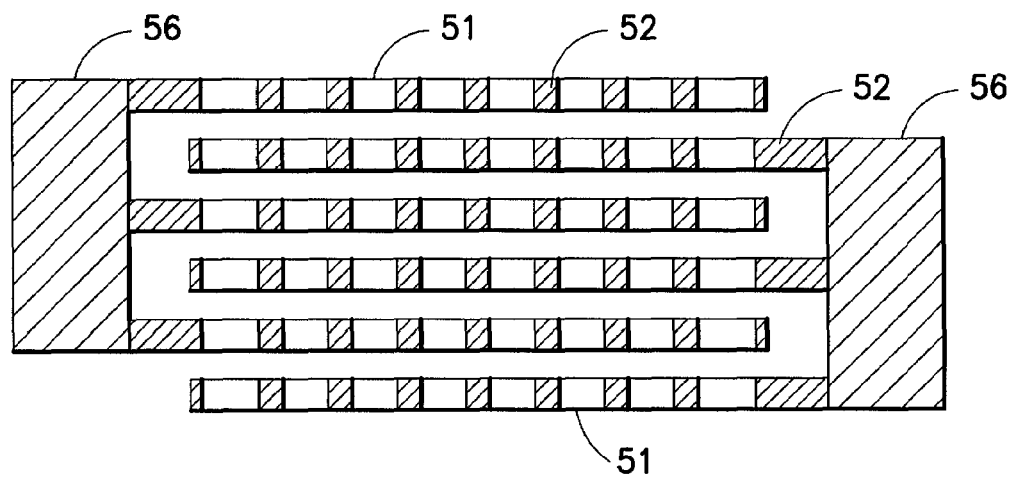
FIG. 2 shows cross sectional view of the same set of plates having perforations.

FIG. 2 shows the same plates, illustratively having an area 30 micron$^2$ while the overlap area is 25 micron$^2$, with the addition of a set of holes 51 that are aligned vertically in each plate, regardless of polarity. The holes 51 are separated by solid portions 52 of the plates. Illustratively, the overlap area of the plates of the two polarities is 25 microns$^2$ and the 30 holes are 0.42 microns by 0.42 microns. The local hole density is 17.6%.

Figure 3:
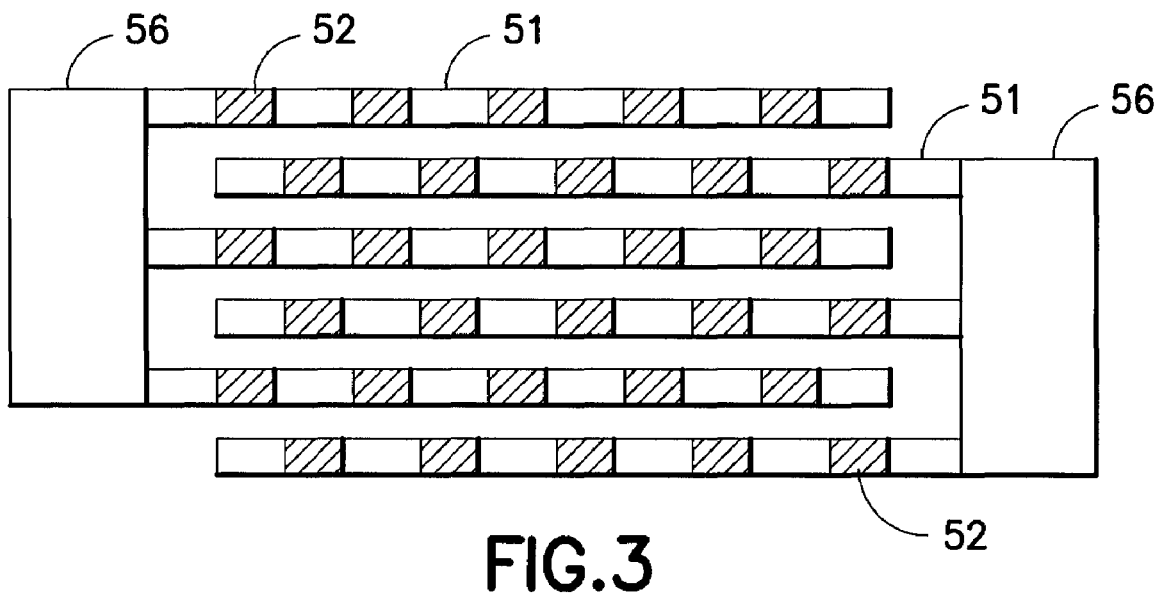
FIG. 3 shows the plates of FIG. 2 with the holes offset.

FIG. 3 shows an alternative version in which the holes on alternate plates are staggered, so that a hole 51 on a plate of one polarity is aligned vertically with a solid portion 52 of the plate immediately above and below.

Figure 4:
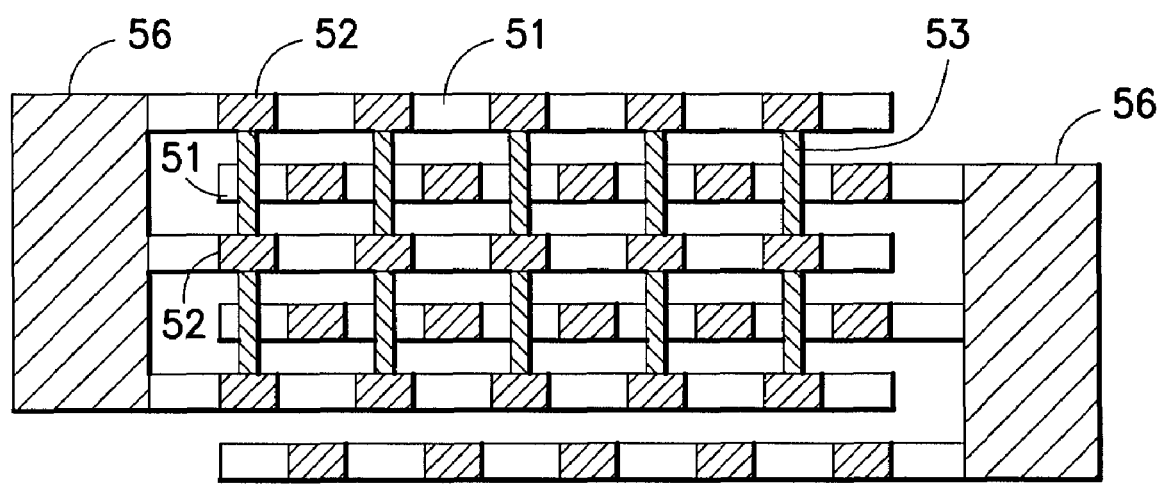
FIG. 4 shows the plates with the plates of one polarity being connected by vertical conductors.

FIG. 4 shows the same hole arrangement as FIG. 3, but with the addition of 0.14×0.14 micron vertical conductive members (vias) 53 connecting vertically one polarity of plates, whether positive or negative.

Figure 5:
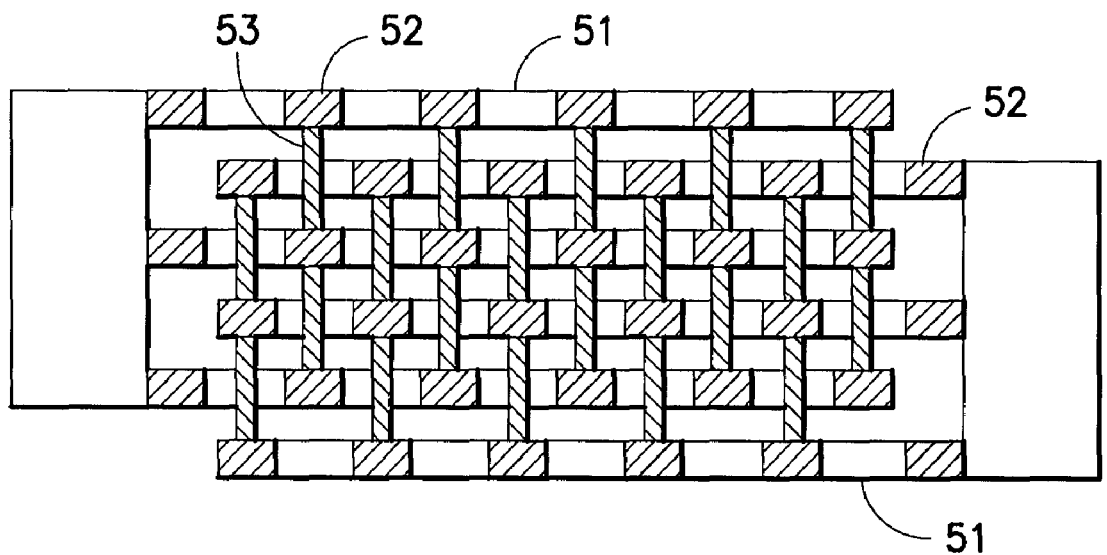
FIG. 5 shows the plates with vertical connectors connecting all the plates of each polarity.

FIG. 5 shows the addition of another set of vias 53 to the opposite polarity of plates, so that all plates are connected to plates of the same polarity.

Figure 6:
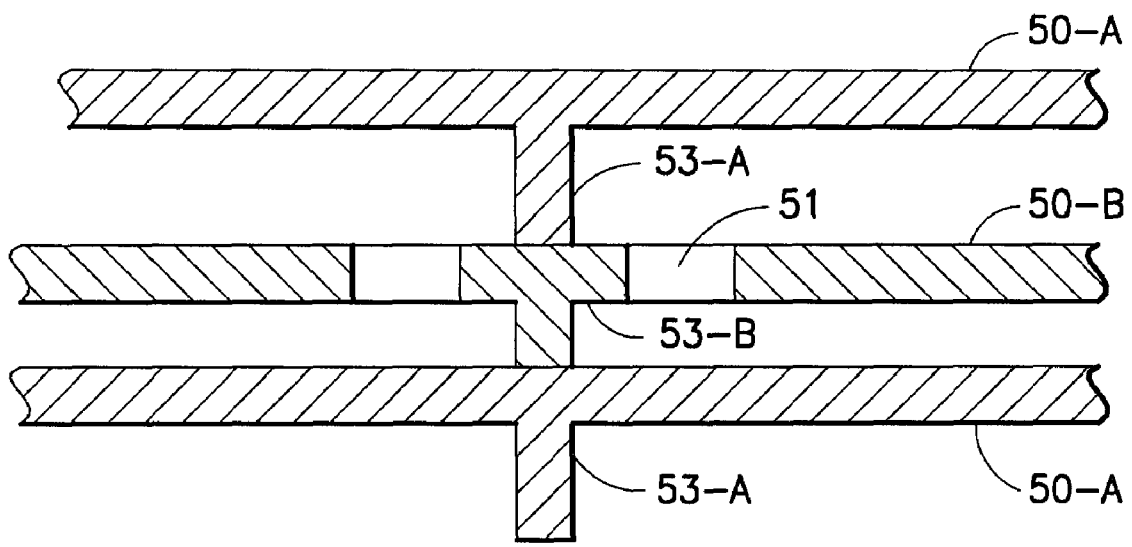
FIG. 6 shows a detail of the connection between vertical connectors on adjacent levels.

FIG. 6 illustrates a detail of the vertical connectors 53. Plates 50-A belong to one of the first and second sets of plates. Plate 50-B belongs to the other set of plates. Plates 50 are formed by the same damascene technique, well known to those skilled in the art, that forms the other interconnects on this level. Vertical members 53-A are formed using the dual damascene technique simultaneously with plates 50-A. At the center of the Figure, plate 50-B is formed using the same damascene technique and simultaneously member 53-B is formed in aperture 51 and isolated from plate 50-B. Optionally, the top of member 53-B is widened, so that alignment tolerance is provided for the connection with upper member 53-A. The width of the widened member will be determined by the width of aperture 51 and the ground rules for the gap between 53-B and the walls of plate 50-B.

TABLE

Comparison of Capacitance Density

| FIG. | Structure Description | Area $\mu m^2$ | Total Capacitance (fF) | Cap. Density (fF/$\mu m^2$) | Density Ratio to Structure 1 |
|---|---|---|---|---|---|
| 1 | No Perforations | 30 | 16.9779 | 0.566 | N/A |
| 2 | 18% perf., holes aligned | 30 | 16.2798 | 0.543 | 0.959 |
| 3 | 18% perf., holes staggered | 30 | 15.9160 | 0.531 | 0.938 |
| 4 | 18% perf., w/vert. vias, half plates staggered | 30 | 19.3063 | 0.644 | 1.138 |
| 5 | 18% perf., w/vert. vias, all plates connected | 30 | 22.4531 | 0.748 | 1.322 |
| 6 | 38% perf., holes aligned | 30 | 15.0257 | 0.501 | 0.885 |

In all cases in Table I, the overlap area of the plates is 25 micron$^2$.

As can be seen in Table I, the perforated but unconnected version of FIG. 2 has 4.1% less capacitance density than the version of FIG. 1.

Similarly, the perforated and unconnected version of FIG. 3 also has less capacitance density than the embodiment of FIG. 1. The aligned version of FIG. 1 benefits from the edge capacitance of the holes.

Connecting the vias improves the capacitance ratio substantially, as well as taking up less area after the removal of the vertical connection bars 56.

As can be seen from example 6 from table I, more perforation in copper plates results in lower capacitance. However, the loss in capacitance is much smaller than one skilled in the art would expect. When copper plates are perforated at 38%, the capacitance loss is approximately 11.5%.

The Figures show an even number of plates in the capacitor. Those skilled in the art will understand that an odd number of plates may also be used, so that the top and bottom plates will have the same polarity, e.g. ground.

While the invention has been described in terms of a single preferred embodiment, those skilled in the art will recognize that the invention can be practiced in various versions within the spirit and scope of the following claims.

What is claimed is:

1. A parallel plate capacitor for use in an integrated circuit comprising a set of capacitor plates disposed on consecutive levels in the back end of an integrated circuit, alternate ones of the capacitor plates overlapping with adjacent capacitor plates and being adapted to connect to electrical sources of opposite polarity, thereby forming a first set of a first polarity and a second set of a second polarity, said capacitor plates being formed simultaneously with other interconnections located on the same respective consecutive levels in the remaining portion of the integrated circuit outside of the parallel plate capacitor; whereby said capacitor plates have the same thickness as said other interconnections and are separated vertically by the same amount of interlevel dielectric, in which:

each of said capacitor plates is a solid continuous layer located entirely within each of the respective consecutive levels, wherein each of said capacitor plates comprises a set of perforations formed within said respective solid continuous layers and each of said sets of perforations are located within each of the respective consecutive levels, and further wherein said perforations in said first set of capacitor plates and said perforations in said second set of capacitor plates are aligned to form respective openings that extend entirely though said adjacent capacitor plates, said respective openings are oriented in a direction substantially normal to said consecutive levels.

2. A capacitor according to claim 1, in which said capacitor plates comprise copper.

* * * * *